United States Patent [19]

Wall

[11] 4,112,509
[45] Sep. 5, 1978

[54] ELECTRICALLY ALTERABLE FLOATING GATE SEMICONDUCTOR MEMORY DEVICE

[75] Inventor: Lawrence S. Wall, Houston, Tex.

[73] Assignee: Texas Instruments Incorporated, Dallas, Tex.

[21] Appl. No.: 754,144

[22] Filed: Dec. 27, 1976

[51] Int. Cl.² ............................................. G11C 11/40
[52] U.S. Cl. ...................................... 365/185; 357/23
[58] Field of Search .................. 340/173 R, 173 CA; 357/23; 307/238; 365/184, 185

[56] References Cited

U.S. PATENT DOCUMENTS

| 3,760,378 | 9/1973 | Burns | 340/173 R |
| 3,836,992 | 9/1974 | Abbas et al. | 357/23 |
| 3,984,822 | 10/1976 | Simko et al. | 340/173 R |

OTHER PUBLICATIONS

Chang, Nonvolatile Semiconductor Memory Devices, Proceedings of the IEEE, vol. 64, No. 7, 7/76, pp. 1039-1059.
Iizuka, et al., Electrically Alterable Avalanche-Injection-Type MOS Read Only Memory with Stacked-Gate Structure, IEEE, Trans. on Electron Dev., 4/76, pp. 379-387.
Terman, Floating Avalanche-Injection Metal-Oxide Semiconductor Device with Low-Write Voltage, IBM Tech. Disclosure Bul. vol. 14, No. 12, 5/72, p. 3721.

*Primary Examiner*—Stuart N. Hecker
*Attorney, Agent, or Firm*—James T. Comfort; John G. Graham

[57] ABSTRACT

An N-channel, double level poly, MOS read only memory or ROM array is electrically programmable by floating gates which are interposed between the gate oxide and control gates formed by row address lines. The cells may be electrically erased by applying selected voltages to the source, drain, control gate and substrate; the floating gate discharges through the insulator between the floating gate and the control gate, i.e., between first and second level polysilicon.

10 Claims, 7 Drawing Figures

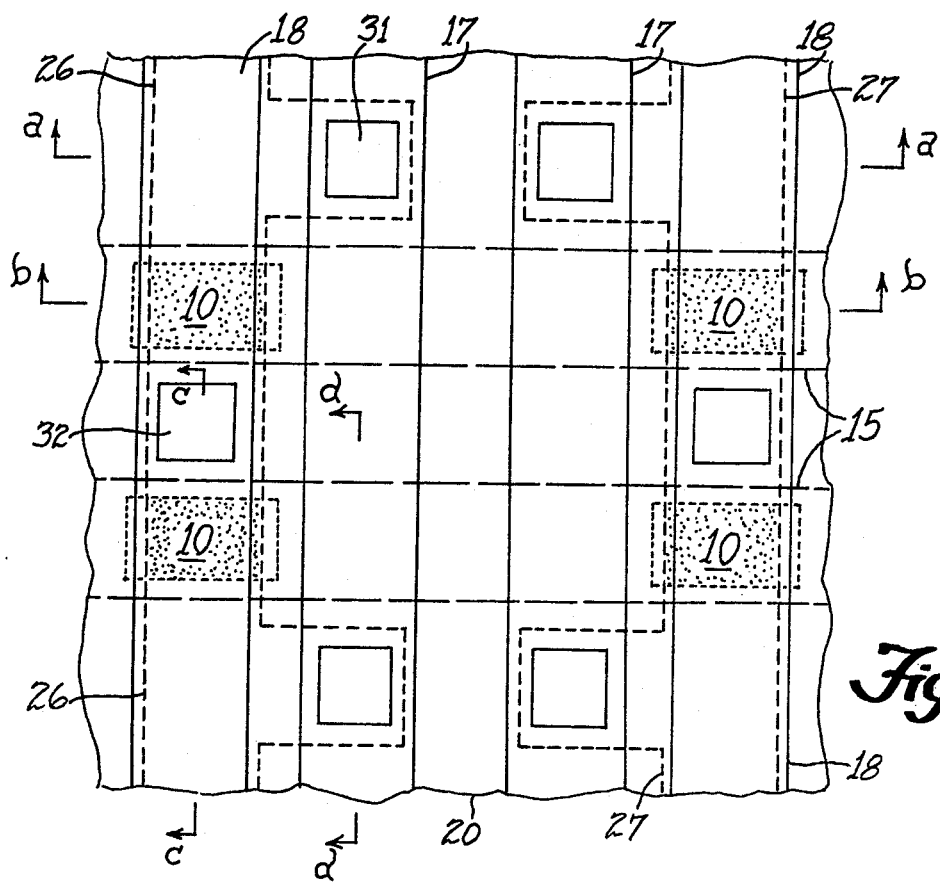
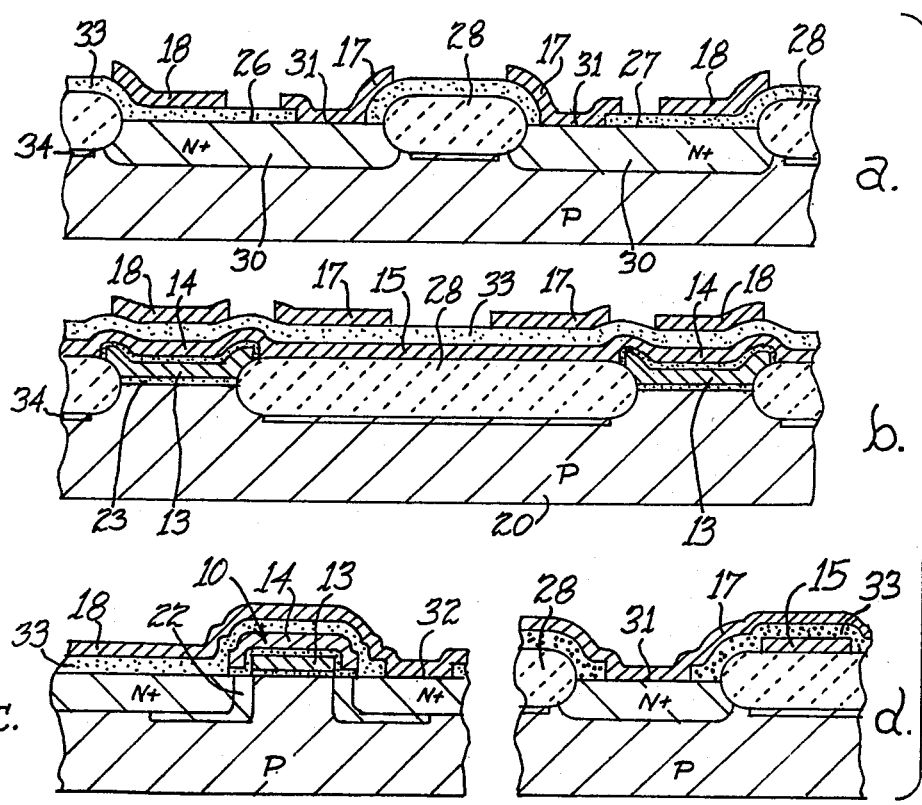

ELECTRICALLY ALTERABLE FLOATING GATE SEMICONDUCTOR MEMORY DEVICE

BACKGROUND OF THE INVENTION

This invention relates to semiconductor memory devices and more particularly to an MOS ROM which is electrically erasable and electrically programmable.

Semiconductor memory devices which are nonvolatile have great utility in that the information stored is not lost when the power supply is removed. The most common example of a nonvolatile memory is the MOS ROM wherein the stored information is permanently fixed upon manufacture by the gate level mask or moat mask as set forth in U.S. Pat. No. 3,541,543, assigned to Texas Instruments. Most calculators and microprocessor systems employ ROM's of this type to store a program consisting of a large number of instruction words. However, it would be preferable to program the ROM devices after manufacture so all devices are made the same and no unique masks are required. Various electrically programmable ROM devices have been developed such as that shown in U.S. Pat. No. 3,984,822 which employs a floating gate in a double level polysilicon MOS ROM; the floating gate is charged by injection of electrons from the channel, and stays charged for years. Other devices of this type have employed charge storage on a nitride-oxide interface. However, even though the devices are electrically programmable, some are not electrically alterable or deprogrammable. To change the program it was necessary to expose the semiconductor chip to ultraviolet light, for example. This requires the device to be packaged with a quartz window above the chip, and then the package must be housed in an accessible location in the system. Electrically alterable ROM's have been developed as set forth in U.S. Pat. Nos. 3,881,180, issued Apr. 29, 1975, 3,882,469, issued May 6, 1975, 4,037,242 issued July 19, 1977, all by M. W. Gosney and assigned to Texas Instruments; the Gosney devices are floating gate cells with dual injection (both holes and electrons) so that the gates may be charged or discharged. However, the prior cells have exhibited some undesirable characteristic such as large cell size, process incompatible with standard techniques, high voltages needed for programming, etc.

It is therefore the principal object of the invention to provide an improved electrically programmable semiconductor memory cell, particularly an electrically alterable cell. Another object is to provide an electrically alterable cell which is of small cell size when formed in a semiconductor integrated circuit. A further object is to provide a process for making electrically alterable memory cells compatible with N-channel silicon gate technology. Another object is to provide such a device which uses only a single polarity power supply during write and erase.

SUMMARY OF THE INVENTION

In accordance with an embodiment of the invention, a floating gate MOS programmable ROM cell is provided which is made by an N-channel, silicon-gate, self-aligned, double level poly process which is compatible with standard processing techniques. The floating gate is formed by the first level polysilicon which is isolated from the second level poly by an insulator. The cells may be electrically altered or deprogrammed through this insulator by applying proper voltages to the sources, drains, gates and substrate.

THE DRAWINGS

The novel features believed characteristic of the invention are set forth in the appended claims. The invention itself, however as well as other features and advantages thereof, may best be understood by reference to the following detailed description of illustrative embodiments, when read in conjunction with the accompanying drawings, wherein:

FIG. 4 is a plan view of a part of a semiconductor integrated circuit chip containing an array of the cells of FIGS. 1 and 2;

FIGS. 5a to 5d are elevation views in section of the array of FIG. 4, taken along the lines a—a, b—b, c—c, and d—d, respectively, in FIG. 4;

DETAILED DESCRIPTION OF SPECIFIC EMBODIMENT

Figure 1:
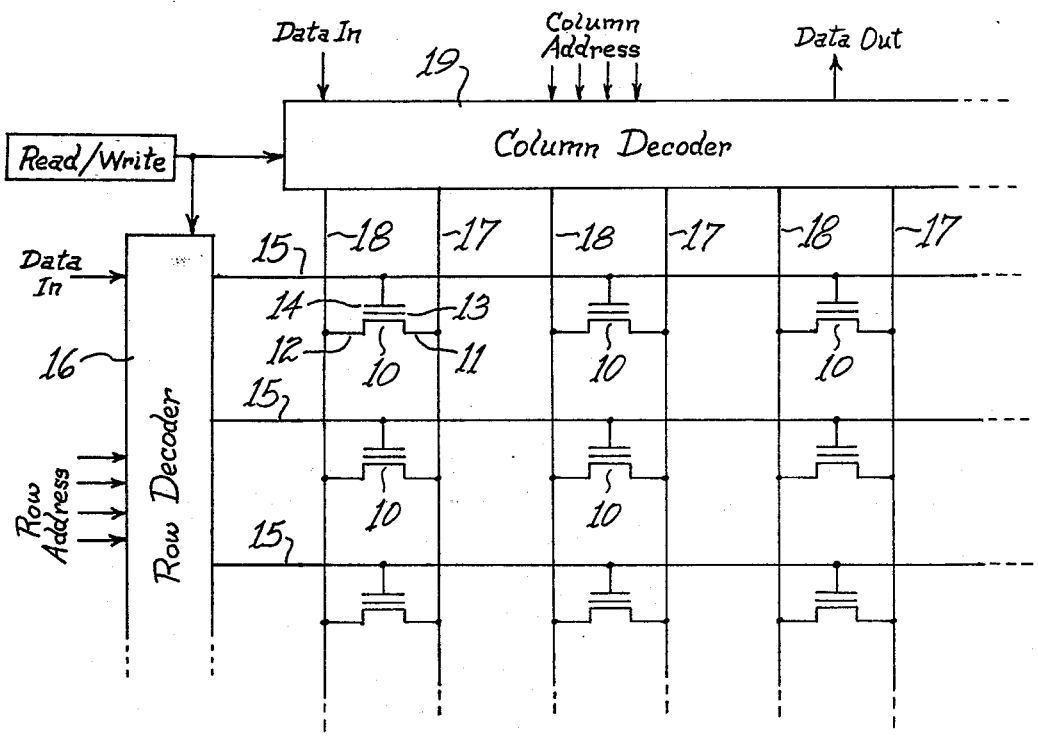
FIG. 1 is an electrical schematic diagram of an array of memory cells according to the invention.

Referring now to FIG. 1, an array of memory cells is shown which may use the invention. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source electrodes 11 in a column of cells are connected in common to a source column line 17, and likewise all of the drain electrodes 12 in a column of cells are connected in common to a drain column line 18. The source and drain column lines 17 and 18 are connected to a column decoder 19. In a write or program mode, the column decoder functions to apply either a high voltage (about +25 v) or a low voltage (ground or $V_{ss}$) to each of the source and drain column lines 17 and 18 in each column, in response to a column address and a "0" or "1" data input. For write or program operations, the row decoder 16 functions to apply a high voltage or low voltage to each of the row lines 15 in response to a row address.

Figure 2:
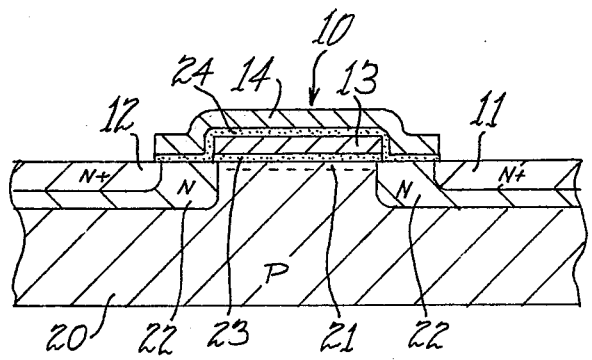
FIG. 2 is an enlarged sectional view of one of the memory cells in the array of FIG. 1.
Figures 6, 7:
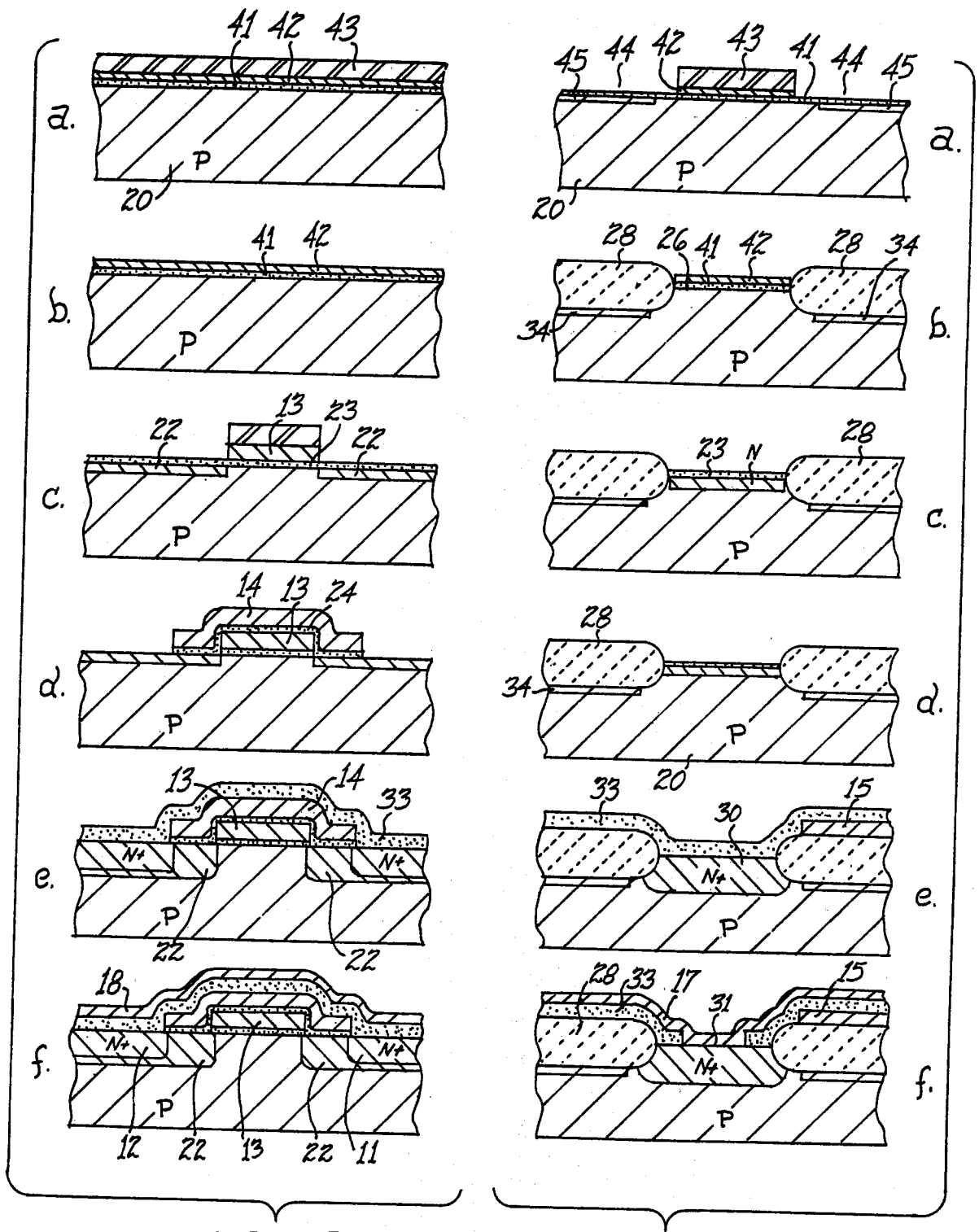
FIGS. 6a-6f are sectional views corresponding to FIG. 2 showing a cell according to the invention at various stages of manufacture.
FIGS. 7a-7f are sectional views corresponding to FIG. 5 showing the array at successive stages of manufacture.

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 between N-type implanted regions 22 which connect to the source 11 and drain 12. The channel region 21 lies beneath floating gate 13 which is composed of phosphorus-doped polycrystalline silicon. The floating gate 13 is insulated from the underlying channel region 21 by a gate oxide layer 23 which is thermally-grown silicon oxide of a thickness of perhaps 700 to 1200Å. The control gate 14 is also composed of phosphorus-doped polycrystalline silicon in this case extending beyond the edges of the floating gate 13. It is not necessary that the control gate be wider than the floating gate except for alignment purposes in manufacture. The control gate 14 is isolated from the floating gate by a thermal oxide layer 24 which is of selected thickness. Generally, the thickness of the oxide layer 24 is about half that of prior art Ep/ROM devices which did not operate according to the invention. Depending upon a number of factors such as process variations, desired operating voltages and conditions, and the like, the layer 24 may be, for example, 600 to 1200Å in thickness; the object is for charge to escape from the floating gate 13 when the electric field across the oxide layer 24 is high, whereas ordinarily this leakage is an undesirable condition and is avoided by making the oxide layer 24 much thicker than the gate oxide 23, for example about 2000Å.

In operation of the device thus far described, the memory system has two different operating modes, one for writing or programming where high voltages (20 to 25 v) are used, and another for read or recall where standard N-channel operating voltages of perhaps 5 or 10 v. are used. Considering one of the cell transistors 10, if the source 11 is at ground or $V_{ss}$, the drain 12 is at the high voltage level $V_p$ (25 v.), the control gate 14 is at high voltage, and the substrate 20 is at ground or $V_{ss}$, then negative charge will accumulate on the floating gate 13 due to injection of electrons through the oxide 23. This programs the device to store a "1" because the charged gate 13 shields the channel region 21 from the gate 14 so that the channel cannot be inverted even though the gate 14 has a positive voltage thereon. To deprogram the cell, or to write a "0" into the cell, the conditions are the same except that the drain 12 is also taken to a low voltage, $V_{ss}$. In this condition, charge escapes from the floating gate, so in effect, the threshold voltage of the MOS transistor is lowered. A +5 v. logic level on the gate 14 will subsequently invert the channel 21 and turn on the device. In the program mode, the rows of cells in the array which are not addressed will have low voltage ($V_{ss}$) on the gates 14; that is, the row address lines 15 will be at $V_{ss}$ except for the addressed row for programming which will be at $V_p$ or +25 v. All of the transistors in the rows other than the addressed row will be immune to change because their control gate voltages will be low. For the non-addressed columns, both source line 17 and drain line 18 are taken to the high voltage level +25 v.; i.e., the lines 17 and 18 are both forced to the high level by the decoder circuitry 19 except the column addressed for programming. For the addressed column, the source line 17 is at $V_{ss}$ and the drain line 18 is at $V_p$ to write a "1" or $V_{ss}$ to write "0".

Figure 3:
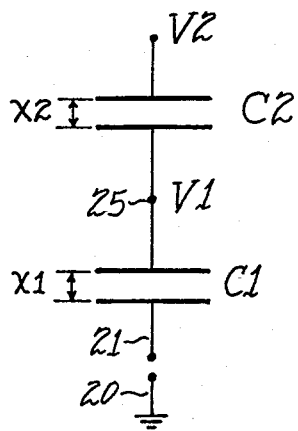
FIG. 3 is a schematic representation of the operation of the cell of FIG. 2.

The deprogramming phenomenon of the cell of the invention may be explained by assuming that the double level poly structure of FIG. 2 forms two capacitors C1 and C2 in series as seen in FIG. 3. V1 is the voltage on the floating gate 13 and V2 is the voltage on the control gate 14. If a charge Q exists on a node 25 between the two capacitors C1 and C2, then with V2 applied to the control gate 14 the voltage V1 will equal (Q + V2C2)/C1 + C2), while the field E2 across the second level oxide layer 24 is (V2 − V1)/X2. Thus E2 equals (V2C1 − Q)/X2(C1 + C2). When the source 11 and drain 12 of a device of this type are taken to V2, the channel 21 inverts and assumes the potential V2 also. Then the field across C2 will drop to E2' which is (−Q)/X2(C1 + C2). Since leakage is a strong function of the electric field, when the source and drain are low and the gate is high (the electric field is E2), electrons leak between the floating gate 13 and the control gate 14 so the device "erases." But when the source and drain are high, the electric field E2' is low enough to prevent leakage.

As an example, assume a "1" is to be written into the upper left cell 10 in FIG. 1 (a "1" is the condition where a negative charge is on the floating gate 13). The top line 15 is taken high while the remaining address lines 15 are held low or at $V_{ss}$. The left-hand source line 17 is held low at $V_{ss}$ while the remaining lines 17 are high at $V_p$. All of the drain lines 18 are high. To write "0," the exact same conditions exist, except that the left hand line 18 would be also low at $V_{ss}$.

Referring now to FIG. 4, a part of a cell array according to the invention is illustrated. FIGS. 5a to 5d are sectional views of the device of FIG. 4, as in FIG. 2, showing details of construction. The area shown in FIG. 4 is about 2 by 3 mils in size; the cell array may contain, for example, 4096 cells or other power of two. The four transistors 10 for the cells shown are created in two parallel elongated moats 26 and 27 which are surrounded by thick field oxide 28 on the upper face of the chip 20. N+ diffused regions 30 in the moats 26 and 27 form interconnections to the sources and drains of the transistors. Elongated parallel strips of polycrystalline silicon form the address lines 15 and the control gates 14 of the transistors. The floating gates 13 are buried beneath the strips 15. Parallel vertical metal strips form the source and drain lines 17 and 18, and these lines contact the sources at contact areas 31 and the drains at contact areas 32 where the metal, which is the top layer, extends down to make contact to N+ diffused areas of the moats 26 and 27. Each contact area is shared with an adjacent cell, so these need be on average only one contact area per cell. The metal lines 17 and 18 are insulated from the second level poly lines 15 by a thick oxide layer 33.

The voltages needed for programming and deprogramming will vary, depending upon a variety of process variables, but will be in the area of 20 to 30 volts. With appropriate process controls, and perhaps at the expense of yield, the voltage may be lower, in the area of 15 volts. Another variable is the change in threshold voltage $V_{tx}$ of the transistor 10 between programmed "1" and "0." In one example, a change in threshold of from 3 v. to 11 v. was achieved.

Turning now to FIGS. 6a–6e and 7a–7e, a process for manufacturing the devices described above will be explained. Note that FIGS. 6a–6e correspond to the sectional view of FIG. 2 in the finished device, that is to line 2—2 in FIG. 4, while FIGS. 7a–7e correspond to the sectional view of FIG. 5d, that is to the line d—d in FIG. 4.

This is basically an N-channel, silicon-gate, self-aligned double level poly process for making MOS integrated circuit devices. The starting material is a slice of P-type monocrystalline silicon, perhaps 3 inches in diameter and 30 mils thick, cut on the <100> plane, of P-type doped with boron in growing to a resistivity of about 6 to 8 ohm-cm. In the FIGS. 4–7, the wafer or body 20 represents a very small part of the slice, chosen as representative sample cross sections. First, after appropriate cleaning, the slice is oxidized by exposing to oxygen in a furnace at an elevated temperature of perhaps 1000° C to produce an oxide layer 41 of a thickness of about 1000Å. Next, a layer 42 of silicon nitride $Si_3N_4$ is formed by exposing to an atmosphere of silane and ammonia in an rf reactor. This nitride layer 42 is grown to a thickness of about 1000Å. A coating 43 of photoresist is applied to the entire top surface, then exposed to ultraviolet light through a mask which defines the desired pattern, and developed. This leaves areas 44 where nitride is to be etched away; these are the areas where field oxide 33 is to be grown. The slice is subjected to a plasma etch, which removes the part of the nitride layer 42 not covered by the exposed photoresist 43, but does not remove the oxide layer 41 and does not react with the photoresist 43.

The slice is now subjected to an ion implant step, preferably using another oversized moat mask, whereby boron atoms are implanted in the areas 44 of silicon not covered by photoresist 43 which masks the implant. Boron is an impurity which produces P-type conductivity, so a more heavily doped P+ region 45 will be produced in the surface. The oxide layer 41 is left in place during the implant because it prevents the implanted boron atoms from out-diffusing from the surface during subsequent heat treatment. The boron implant is at a dosage of about $4 \times 10^{13}/cm^2$ at 100 KeV. After the implant, the photoresist layer 43 is removed.

As will be seen, the regions 45 do not exist in the same form in the finished device, because some of this part of the slice will have been consumed in the oxidation procedure. The implanted regions 45 will ultimately produce the P+ channel stop regions 34.

As set forth in patent application Ser. No. 684,593, filed Jan. 12, 1975, by G. R. Mohan Rao, assigned to Texas Instruments, now U.S. Pat. No. 4,055,444 issued Oct. 25, 1977, the next step in the process is to subject the slice to a heat treatment or annealling step, during which the slice is maintained at a temperature of about 1000° C for perhaps approximately 2 hours in an inert atmosphere, preferably nitrogen. This step causes the boron concentration to change markedly, which has desirable effects aside from reduction in bulk damage in the crystal structure caused by the implant. The P+ regions 45 will have penetrated deeper into the silicon surface after the anneal step.

The following step in the process is formation of field oxide, which is done by subjecting the slices to steam or an oxidizing atmosphere at about 900° C for perhaps 20 hours. As seen in FIG. 7b, this causes a thick field oxide region or layer 28 to be grown, and this region extends into the silicon surface because silicon is consumed as it oxidizes. The nitride layer 42 masks oxidation beneath it. The thickness of this layer 28 is about 8000 to 10,000Å, half of which is above the original surface and half below. The boron doped P+ region 45 as previously implanted and modified by the anneal step will be partly consumed, but will also diffuse further into the silicon ahead of the oxidation front. Thus, the P+ regions 34 will result which will be deeper and of more uniform and acceptable concentration at the surface compared to what would have resulted without the anneal step. Also, the regions 34 will not have the extent of crystalline structure damage characteristic of implanted devices.

The nitride layer 42 and its underlying oxide layer 41 are removed by etching, as the next step, and another thin silicon oxide layer 23 of about 800Å is grown over the exposed areas of silicon.

At this time, although not reflected in the FIGURES, ion implant steps may be performed to create the desired threshold or operating parameters in transistors in the integrated circuit, either in the cell array or in the peripheral circuits such as decoders, output buffers, input latches and buffers, clock generators and the like. First, boron may be implanted at 50 KeV to a dosage of about $2.5 \times 10^{11}$ atoms/cm$^2$ for the purpose of adjusting the threshold voltage of thin oxide enhancement mode transistors so that substrate bias voltage will not be needed. Then, a photoresist layer may be applied and patterned to expose the channel areas of depletion load transistors in peripheral circuitry. These areas are then subjected to a phosphorus implant at 150 KeV with a dosage of about $1 \times 10^{12}/cm^2$. This phosphorus implant is selected to produce a compromise of high speed and low power for devices in the peripheral circuits.

Windows for first level polysilicon to substrate contacts (none seen in these views) are patterned and etched using photoresist, removing the gate oxide layer 23 in selected areas. Next, a layer of polycrystalline silicon is deposited over the entire slice in a reactor using standard techniques, for example by decomposition of silane in hydrogen at about 930° C to a thickness of about one-half micron, producing the polysilicon which will ultimately form the floating gates 13. The layer of poly is subjected to a phosphorus deposition and diffusion to render it highly conductive. This diffusion does not penetrate the substrate 20 except at the poly to silicon contact areas (not shown).

Referring to FIG. 6c, the polysilicon coating and the underlying gate oxide or thin oxide layer 36 are next patterned. This is done by applying a layer of photoresist, exposing to ultraviolet light through a mask prepared for this purpose, developing, then etching with the remaining photoresist masking certain areas of the polysilicon. The resulting structure is seen in FIG. 6c, where a part of the remaining polysilicon layer provides what will be the floating gate 13 of one of the transistors 10.

The slice is next subjected to a phosphorus implant or deposition which will create the lightly doped implanted N-type regions 22. A photoresist mask step covers areas where implant is not wanted, if necessary. This implant is aligned with the first level poly and underlying oxide 23.

After patterning the polysilicon to provide the floating gates 13 and the implant or deposition for the regions 22, the layer 24 of silicon dioxide is grown on the polysilicon, producing a coating on all exposed surfaces of the poly, as seen in FIG. 6d, including tops and sides. The layer 24 is grown at about 1100° C in oxygen for about ½ hour, producing approximately 600Å to 1000Å thickness and consuming part of the polysilicon. If second level poly to silicon contacts are needed, contact areas would be opened at this point.

The second level polysilicon is next deposited over the entire top surface of the slice over the oxide layer 24, using a reaction as above, to provide the control gates 14 and strips 15. The second level poly is patterned using photoresist to define the strips 15, and the oxide layer 24 is etched away in all areas except under the strips 15. A deposition and diffusion operation now produces the heavily doped N+ source and drain regions 11 and 12 as well as the regions 30 in the moats 26 and 27 and the N+ regions under the contact areas 31 and 32.

Using the remaining polysilicon strips 15 and thin oxide 24 as a diffusion mask, the slide is now subjected to an N+ diffusion, whereby phosphorus is deposited and then diffused into the silicon slice 20 to produce the N+ source and drain regions 11 and 12 as well as the regions 30 in the moats 26 and 27 and the N+ regions under the contact areas 31 and 32. The depth of diffusion is about 8000 to 10,000Å. The N+ diffused regions function as conductors which connect the various regions together, and also function as the source or drain regions. This diffusion also heavily dopes all the exposed polysilicon areas such as the control gates 14 and lines 15.

As seen in FIGS. 6e and 7e, fabrication of the device is continued by depositing a layer 33 of phosphorus-doped oxide. Rather than by oxidizing, this is done by a low temperature reaction process using conventional chemical vapor deposition techniques. A layer 33 of about 6000Å is produced, covering the entire slice. This deposition is followed by a "densification" step wherein the slice is heated at 950° C for the purpose of eliminating minute holes or pores in the oxide. Subsequently, a photoresist operation opens windows in the oxide layer 33 in areas 31 and 32 where contact is to be made from metal to the moat or from metal to the polysilicon layer (none seen in the illustrative embodiment). Then, a layer of aluminum is deposited on the entire slice, and etched away using photoresist masking to provide the desired pattern of metal interconnections 17 and 18.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically programmable, non-volatile, floating gate, semiconductor memory array comprising: a plurality of MOS transistor devices each having a source, a drain, a floating gate, and a control gate, the transistor devices being arranged in an array of rows and columns; means for connecting the control gates of all devices in each row together to provide row lines; means connecting the sources of all devices in each column together to provide first column lines generally perpendicular to the row lines; means connecting the drains of all devices in each column together to provide second column lines generally parallel to the first column lines; means for selecting one of the row lines and applying a high voltage to it while applying a low voltage to the remaining row lines; means for selecting one of the first column lines and applying a low voltage to it while applying a high voltage to all of the other first column lines; means for applying high voltage to all of the second column lines; and means to deprogram the memory including means for applying low voltage to all of the second column lines.

2. A memory array according to claim 1 wherein the transistor devices are N-channel and the floating gate and control gate are polycrystalline silicon.

3. A memory array according to claim 2 wherein means are provided for reading data from the array by applying a voltage less than said high voltage to a selected one of the row lines and grounding a selected one of the first column lines.

4. A memory array according to claim 3 wherein an insulator between the floating gate and control gate in each of the transistor devices permits the floating gate to discharge when the source and drain are grounded and the control gate is at a high voltage.

5. A memory array according to claim 4 wherein the insulator between the floating gate and control gate is silicon oxide which is less than about 1200 Å in thickness.

6. An electrically programmable, non-volatile, floating gate, semiconductor memory cell array comprising: a plurality of MOS transistors each having a source, a drain, floating gate, and a control gate; an insulating layer separating the floating gate and the control gate in each transistor; a gate insulator separating the floating gate from a channel region between the source and drain in each transistor; the MOS transistors being arranged in an array of rows and columns; row lines connecting together the control gates of all transistors in a row; first column lines generally normal to the row lines connecting together the sources of all transistors in a column; second column lines generally parallel to the first column lines connecting together the drains of all transistors in a column; means including a row line and a second column line for applying high voltage to the drain and control gate of a selected transistor while applying reference potential to the source to program the selected cell by charging the floating gate via electrons traversing the gate insulator; and means including the first and second column lines for applying reference potential to the sources and drains of the transistors while applying high voltage to the control gates to deprogram the cells by discharging the floating gates via current traversing the insulating layer.

7. A memory cell array according to claim 6 wherein the insulating layer is silicon oxide having a thickness less than about 1200 Å.

8. A memory cell array according to claim 6 wherein the MOS transistor is N-channel and the floating gate and control gate are polycrystalline silicon.

9. A memory cell array according to claim 8 wherein the insulating layer is thermally-grown silicon dioxide.

10. A memory cell array according to claim 9 wherein the insulating layer is not more than 150% as thick as the gate insulator.

* * * * *